(12) United States Patent
Lee et al.

(10) Patent No.: US 9,069,521 B2
(45) Date of Patent: Jun. 30, 2015

(54) FOLDABLE DISPLAY DEVICE

(71) Applicants: Kyu-Taek Lee, Yongin (KR); Hak-Sun Kim, Yongin (KR); Akira Hirai, Yongin (KR); Tae-Hyeog Jung, Yongin (KR)

(72) Inventors: Kyu-Taek Lee, Yongin (KR); Hak-Sun Kim, Yongin (KR); Akira Hirai, Yongin (KR); Tae-Hyeog Jung, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 144 days.

(21) Appl. No.: 13/836,069

(22) Filed: Mar. 15, 2013

(65) Prior Publication Data

US 2014/0065326 A1 Mar. 6, 2014

(30) Foreign Application Priority Data

Aug. 28, 2012 (KR) ........................ 10-2012-0094333

(51) Int. Cl.
| | |
|---|---|
| *B32B 7/02* | (2006.01) |
| *A45B 19/00* | (2006.01) |
| *G06F 1/16* | (2006.01) |
| *H05K 7/00* | (2006.01) |
| *G02F 1/1333* | (2006.01) |
| *G09F 9/30* | (2006.01) |
| *H01L 51/00* | (2006.01) |
| *H01L 27/32* | (2006.01) |

(52) U.S. Cl.
CPC ............ *G06F 1/16* (2013.01); *G02F 1/133305* (2013.01); *G06F 1/1652* (2013.01); *G09F 9/301* (2013.01); *H01L 51/0097* (2013.01); *H01L 2251/5338* (2013.01); *H01L 27/3244* (2013.01)

(58) Field of Classification Search
None
See application file for complete search history.

(56) References Cited

U.S. PATENT DOCUMENTS

| | | | |
|---|---|---|---|
| 2004/0095332 A1* | 5/2004 | Blanchard | 345/173 |
| 2009/0052017 A1* | 2/2009 | Sasaki | 359/350 |
| 2010/0194672 A1* | 8/2010 | Kim et al. | 345/77 |
| 2014/0287213 A1* | 9/2014 | Lee et al. | 428/217 |

FOREIGN PATENT DOCUMENTS

| | | | | |
|---|---|---|---|---|
| KR | 10-2007-0003295 A | 1/2007 | | |
| KR | 10-2009-0123465 A | 12/2009 | | |
| KR | 10-0953654 B1 | 4/2010 | | |
| KR | 10-2011-0098349 A | 9/2011 | | |
| KR | 10 20110098349 A1 * | 9/2011 | ............. | G06F 3/041 |

* cited by examiner

*Primary Examiner* — David Sample
*Assistant Examiner* — Nicole T Gugliotta
(74) *Attorney, Agent, or Firm* — Lee & Morse, P.C.

(57) ABSTRACT

A foldable display device includes a flexible display panel and a cover window on an outside of the flexible display panel. The cover window includes a foldable region between plane regions that are on opposite sides of the cover window, and the plane regions have a first hardness and the foldable region has a second hardness that is smaller than the first hardness.

11 Claims, 7 Drawing Sheets

FOLDABLE DISPLAY DEVICE

CROSS REFERENCE TO RELATED APPLICATION

This application claims priority under 35 U.S.C. §119 to Korean Patent Application No. 10-2012-0094333 filed in the Korean Intellectual Property Office on Aug. 28, 2012, the entire contents of which are incorporated herein by reference.

BACKGROUND

A foldable display device may be easily portable when it is folded and may realize a large screen when it is unfolded. The foldable display device may be applied to various fields, such as a television and a monitor, as well as mobile equipment, such as a mobile telephone, an ultra mobile PC, an electron book, and an electron newspaper.

SUMMARY

Embodiments may be realized by providing a foldable display device that includes a flexible display panel and a cover window disposed on the outside of the flexible display panel. The cover window includes a foldable region formed between plane regions formed on both sides having the first hardness and having the second hardness smaller than the first hardness.

The plane regions and the foldable region may include a polymer of poly(methyl methacrylate) (PMMA) and poly(n-butylacrylate) (PnBA). In the plane regions, the ratio of PMMA may be larger than the ratio of PnBA in PMMA and PnBA. In the foldable region, the ratio of PnBA may be larger than the ratio of PMMA in PMMA.

The plane regions may be formed of tempered glass and the foldable region may be formed of an acryl-based resin. The cover window may further include a functional coating layer formed on the external surfaces of the plane regions and the foldable region.

The functional coating layer may include at least one of a hard layer for increasing hardness of the cover window, an anti-reflecting layer for reducing surface reflectance of the cover window, and an anti-fingerprint layer for reducing surface energy of the cover window.

The foldable region may include a rigid unit and a soft unit partitioned with the second width smaller than the first width in a range of the first width with which the foldable region is set to be alternately arranged. The cover window may further include a functional coating layer formed on the external surfaces of the plane regions and the rigid unit and the soft unit.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In order to clearly describe the embodiments, parts that are not related to description are omitted and the same or similar constituent elements are denoted by the same reference numerals in the entire specification. In addition, since the sizes and thicknesses of the constituent elements illustrated in the drawings are arbitrarily represented for better understanding and ease of description, embodiments are not limited to the illustration.

In the drawings, the thicknesses of layers, films, panels, regions, etc., are exaggerated for clarity. In the drawings, for better understanding and ease of description, the thicknesses of partial layers and regions are exaggerated. It will be understood that when an element such as a layer, film, region, or substrate is referred to as being "on" another element, it can be directly on the other element or intervening elements may also be present.

Figure 1:
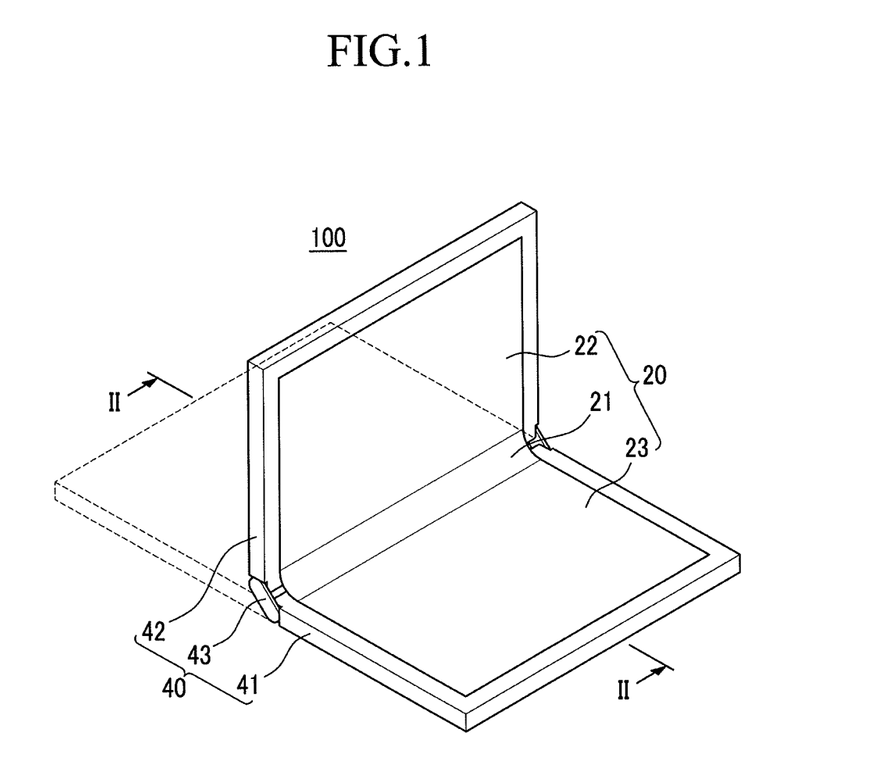
FIG. 1 is a perspective view of a foldable display device according to an exemplary embodiment.
Figure 2:
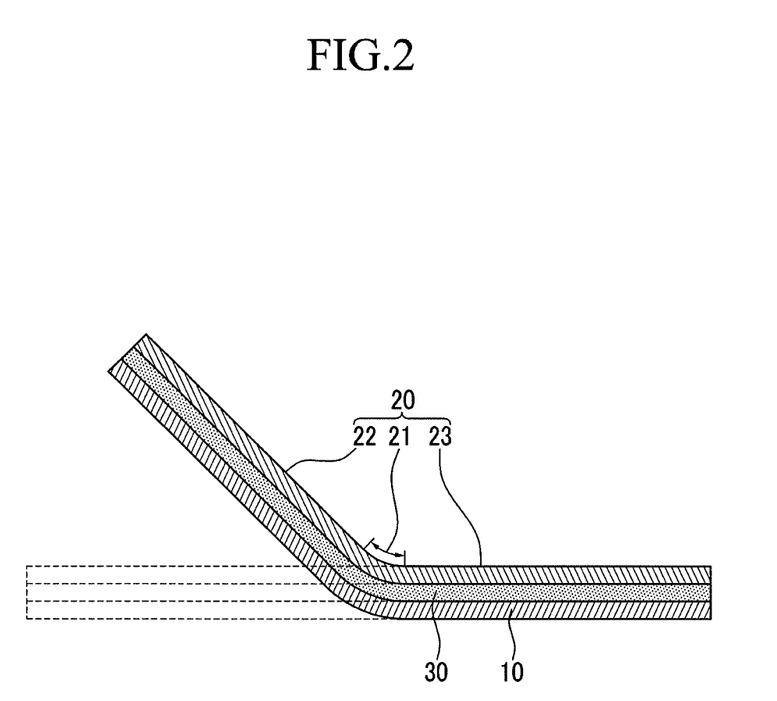
FIG. 2 is a partial cross-sectional view of the foldable display device taken along the line II-II of FIG. 1.

FIG. 1 is a perspective view of a foldable display device according to the first exemplary embodiment. FIG. 2 is a partial cross-sectional view of the foldable display device taken along the line II-II of FIG. 1. Referring to FIG. 1 and FIG. 2, a foldable display device 100 according to the first exemplary embodiment includes a flexible display panel 10, and a cover window 20 that overlaps the flexible display panel 10, e.g., to protect the flexible display panel 10 against external impact.

The flexible display panel 10 includes a flexible film such as a plastic film. According to an exemplary embodiment, an organic light emitting diode (OLED) and a corresponding pixel circuit may be disposed on the flexible film to display an image. The detailed structure of the flexible display panel 10 will be described later. A touch panel 30 for sensing a touch operation of a user may be positioned between the flexible display panel 10 and the cover window 20.

The flexible display panel 10 and the cover window 20 may be fixed to a supporting body 40. The supporting body 40 may include a first supporting unit 41 and a second supporting unit 42. The supporting body 40 may include a hinge unit 43 for connecting the first supporting unit 41 and the second supporting unit 42 to each other. The supporting body 40 may be unfolded or folded around the hinge unit 43. The flexible display panel 10 and the cover window 20 may be unfolded or folded around the hinge unit 43 in accordance with the operation of the supporting body 40.

The cover window 20 is positioned outside the side on which an image is displayed in the flexible display panel 10. The cover window 20 is formed of a transparent and hard material to transmit the image of the flexible display panel 10 therethrough to an outside and to protect the flexible display panel 10 against external impact.

The cover window 20 may be formed of a single layer structure or a multi-layer structure including a polymer of poly(methyl methacrylate) (PMMA) and poly(n-butylacrylate) (PnBA). In FIG. 2, the cover window 20 of the single layer structure is illustrated.

Figure 3:
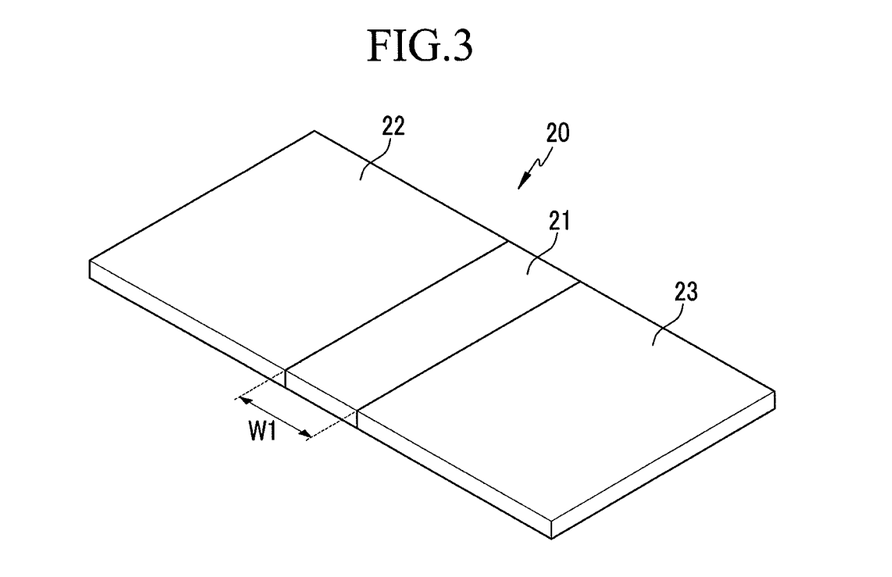
FIG. 3 is a perspective view of a state in which the cover window of FIG. 2 is unfolded.
Figure 4:
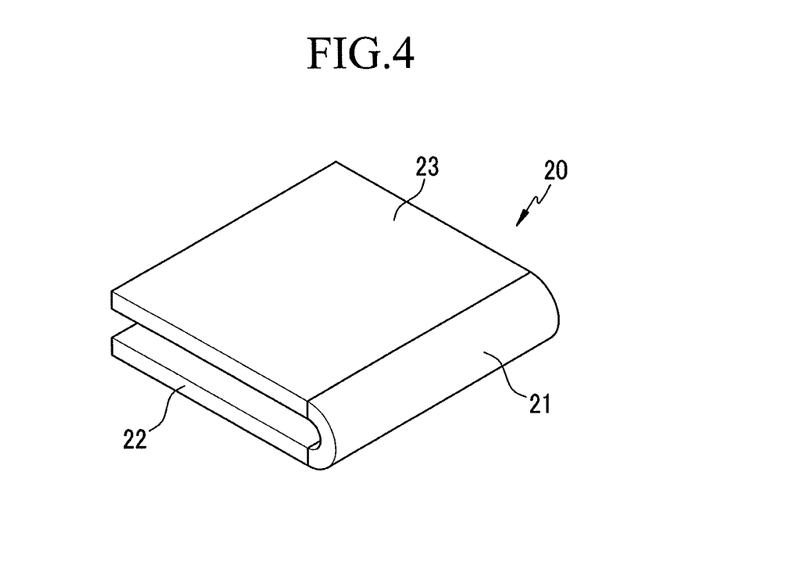
FIG. 4 is a perspective view of a state in which the cover window of FIG. 3 is folded.

FIG. 3 is a perspective view of a state in which the cover window of FIG. 2 is unfolded. FIG. 4 is a perspective view of a state in which the cover window of FIG. 3 is folded. Referring to FIG. 1 to FIG. 4, the cover window 20 includes a foldable region 21 formed between plane regions 22 and 23 formed on opposite sides of the cover window 20. For example, the cover window 20 may be divided into the plane regions 22 and 23 on opposite ends thereof with the foldable region 21 coupled between the plane regions 22 and 23. The plane regions 22 and 23 may have a first hardness, and the foldable region 21 may have a second hardness that is smaller than the first hardness.

The cover window 20 may be formed of the polymer of PMMA and PnBA. PMMA may increase hardness in comparison with PnBA, and PnBA may increase foldability in comparison with PMMA. Different regions of the cover window 20 may have different ratios of PMMA to PnBA.

For example, the plane regions 22 and 23 include a larger ratio of PMMA to PnBA in PMMA and PnBA for forming the corresponding portions of the cover window 20. The plane regions 22 and 23 may be formed such that a weight of PMMA based on a total weight of PMMA and PnBA is greater than a weight of PnBA based on the total weight of PMMA and PnBA.

For example, the foldable region 21 includes a larger ratio of PnBA to PMMA in PMMA and PnBA for forming the corresponding portion of the cover window 20 including. The foldable region 21 may be formed such that a weight of PnBA based on the total weight of PMMA and PnBA is greater than a weight of PMMA to the total weight of PMMA and PnBA.

The weight percentage of PMMA in the foldable region 21 may be less than the weight percentage of PMMA in the plane regions 22 and 22. Further, the weight percentage of PnBA in the foldable region 21 may be greater than weight percentage of PnBA in the plane regions 22 and 23. The plane regions 22 and 23 may be formed such that a ratio of PMMA to PnBA is greater than a ratio of PMMA to PnBA in the foldable region 21. The plane regions 22 and 23 may be formed such that a ratio of PnBA to PMMA is less than a ratio of PnBA to PMMA in the foldable region 21.

According to an exemplary embodiment, the plane regions 22 and 23 may include a greater relative amount of PMMA than the foldable region 21. The plane regions 22 and 23 form a rigid area having larger hardness than the foldable region 21, and the foldable region 21 forms a less rigid or soft area having higher foldability than the plane regions 22 and 23.

The plane regions 22 and 23 are disposed on opposite sides in the first direction of the cover window 20, when unfolded. The plane regions 22 and 23 may be parallel to each other when folded so as to face each other. The foldable region 21 is set to have the first width W1 between the plane regions 22 and 23, and to be longitudinally movably formed in the second direction that intersects the first direction.

The plane regions 22 and 23 that occupy the most area of the cover window 20 provide large surface hardness to the cover window 20 in a state where the flexible display panel 10 is unfolded. The foldable region 21 provides high foldability to the cover window 20 in a state where the flexible display panel 10 is folded.

The plane regions 22 and 23 and the foldable region 21 may be physically combined with each other by a thermo-compression bonding method. For example, when heat and pressure are applied to the foldable region 21, the foldable region 21 may be combined with the plane regions 22 and 23. According to another exemplary embodiment, the plane regions 22 and 23 and the foldable region 21 may be chemically combined with each other by a compress method. For example, when heat is applied to the foldable region 21, the foldable region 21 may be combined with the plane regions 22 and 23.

According to another exemplary embodiment, the plane regions 22 and 23 may be formed of tempered glass and the foldable region 21 may be formed of an acryl-based resin. The acryl-based resin with adhesion may form the foldable region 21 and may be physically combined with the plane regions 22 and 23 formed of tempered glass.

Figure 5:
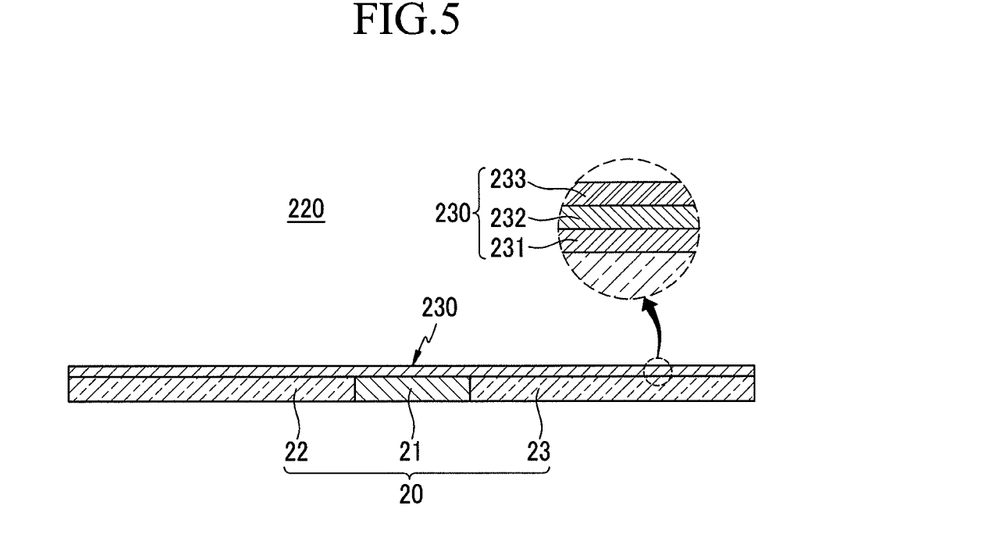
FIG. 5 is a cross-sectional view of a state in which a cover window is unfolded in a foldable display device according to an exemplary embodiment.
Figure 6:
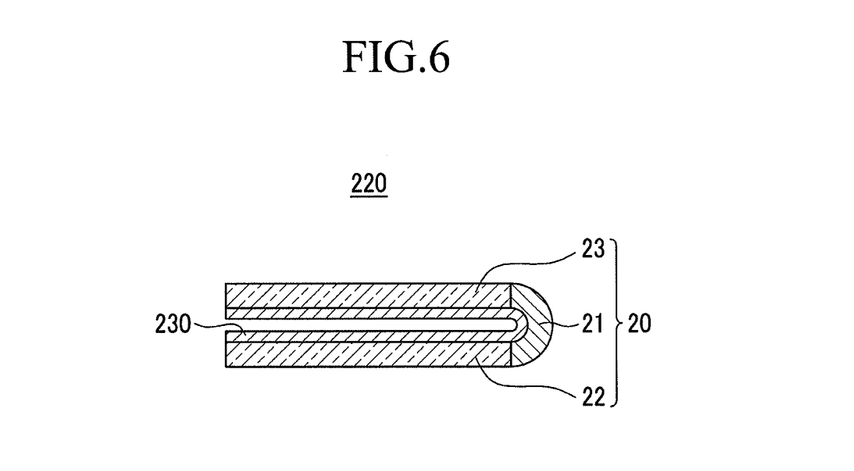
FIG. 6 is a cross-sectional view of a state in which the cover window of FIG. 5 is folded.

FIG. 5 is a cross-sectional view of a state in which a cover window is unfolded in a foldable display device according to the second exemplary embodiment. FIG. 6 is a cross-sectional view of a state in which the cover window of FIG. 5 is folded. Referring to FIG. 5 and FIG. 6, a cover window 220 further includes a functional coating layer 230 in addition to the structure of the cover window 20 according to the first embodiment.

The functional coating layer 230 is formed on the external surfaces of the plane regions 22 and 23 and the foldable region 21 to provide a related function to the cover window 220. For example, the functional coating layer 230 may be formed of at least one of a hard layer 231, an anti-reflecting layer 232, and an anti-fingerprint layer 233. For convenience, in FIG. 5, the exemplary embodiment in which the functional coating layer 230 including the hard layer 231, the anti-reflecting layer 232, and the anti-fingerprint layer 233 sequentially stacked on the cover window 20 is illustrated. However, embodiments are not limited thereto, e.g., only one, two, or more than three layers may be stacked on the cover window 20 and/or the layers may be stacked in a different order on the cover window 20. Each of the hard layer 231, the anti-reflecting layer 232, and the anti-fingerprint layer 233 may have a single layer structure or a multi-layer structure.

For example, the hard layer 231 is coated on the external surface of the cover window 20 of the first exemplary embodiment, e.g., so as to be on the plane regions 22 and 23 and the foldable region 21 to increase the hardness of the cover window 220. The hard layer 231 may be formed of an acryl-based resin or a mixture of acryl-based resin and nano particles. The nano particles may be formed of silica.

The anti-reflecting layer 232 is coated on the hard layer 231, e.g., to reduce the surface reflectance of the cover window 220. For example, the anti-reflecting layer 232 may be formed of an organic thin film and/or an inorganic thin film.

The anti-fingerprint layer 233 is oil or water repellent coated on the anti-reflecting layer 232, e.g., to reduce the surface energy of the cover window 220. For example, the anti-fingerprint layer 233 may be fluorine-based or silicon-based.

According to an exemplary embodiment, the plane regions 22 and 23 are formed of 95 wt % PMMA and 5 wt % PnBA with a thickness of 100 μm, and the foldable region 21 is formed of 80 wt % PMMA and 20 wt % PnBA with a thickness of 100 μm. For example, the ratio based on weight percentage of PMMA to PnBA may be greater in the plane regions 22 and 23 than the ratio based on weight percentage of PMMA to PnBA in the foldable region 21.

The hard layer 231 may be formed of the mixture of acryl-based resin and silica nano particles with a thickness of 20-30 μm. For example, the plane regions 22 and 23 may have a hardness of 5-6 H (a pencil hardness tester, 750 g reference) and the foldable region 21 may have a hardness of 3-4 H (the pencil hardness tester, 750 g reference).

As described above, the surface hardness of 3-6 H of the cover window 220 of the second exemplary embodiment is more excellent than the surface hardness of no more than 2 H of a conventional cover window having an acryl-based hard layer coated on a Polyethylene terephthalate (PET) film of 100 μm with a thickness of several μm.

Figure 7:
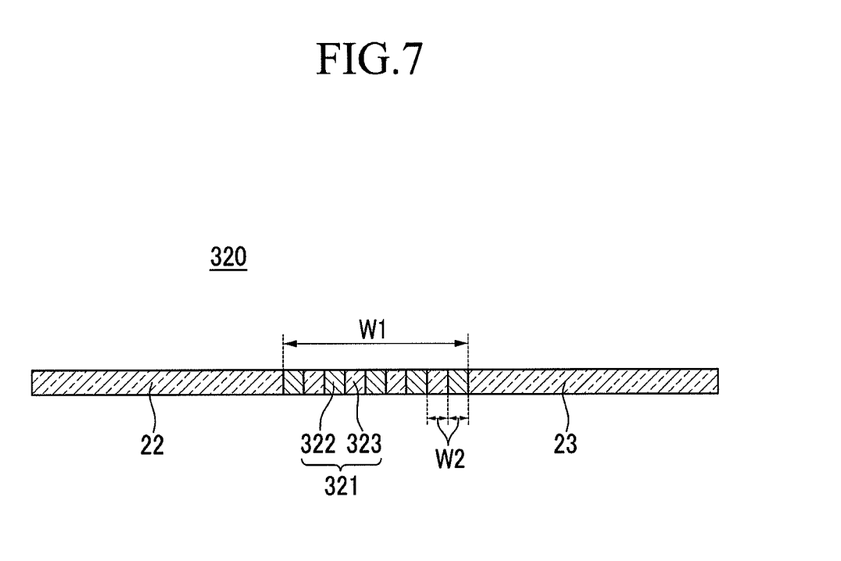
FIG. 7 is a cross-sectional view of a state in which a cover window is unfolded in a foldable display device according to an exemplary embodiment.

FIG. 7 is a cross-sectional view of a state in which a cover window is unfolded in a foldable display device according to the third exemplary embodiment. Referring to FIG. 7, in a cover window 320, a foldable region 321 set between the plane regions 22 and 23 includes a rigid unit 322 and a soft unit 323.

The foldable region 321 is set to have the first width W1. The rigid unit 322 and the soft unit 323 are plural-partitioned with the second width W2 smaller than the first width W1 in the range of the first width W1 and are alternately arranged. The rigid unit 322 may have the first hardness the same as the hardness of the plane regions 22 and 23. The soft unit 323 may have the second hardness at which the foldable region 21 of the first exemplary embodiment is formed.

In the third exemplary embodiment, the rigid unit 322 of the first hardness is included in the foldable region 321 so that the foldable region 321 may have larger hardness than in the first exemplary embodiment where the foldable region 21 is formed at the second hardness.

That is, in the cover window 320 of the third exemplary embodiment, the foldable region 321 has foldability generated by the second hardness and may maintain larger surface hardness than the foldable region 21 of the first exemplary embodiment due to the rigid unit 322.

Figure 8:
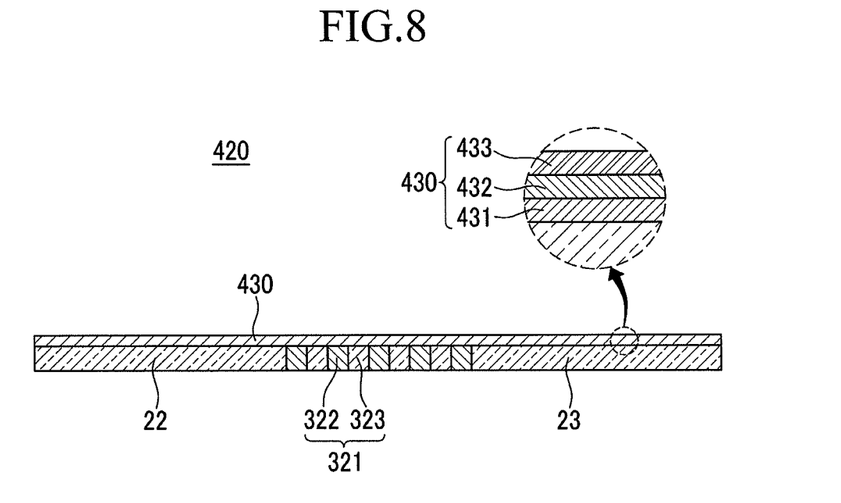
FIG. 8 is a cross-sectional view of a state in which a cover window is unfolded in a foldable display device according to an exemplary embodiment.

FIG. 8 is a cross-sectional view of a state in which a cover window is unfolded in a foldable display device according to the fourth exemplary embodiment. Referring to FIG. 8, a cover window 420 further includes a functional coating layer 430 in addition to the structure of the cover window 320 of the third exemplary embodiment.

The functional coating layer 430 is formed on the external surfaces of the plane regions 22 and 23 and the foldable region 321 (the rigid unit 322 and the soft unit 323) to provide a related function to the cover window 320. For example, the functional coating layer 430 includes at least one of a hard layer 431, an anti-reflecting layer 432, and an anti-fingerprint layer 433. For convenience, in FIG. 8, the functional coating layer 430 including the hard layer 431, the anti-reflecting layer 432, and the anti-fingerprint layer 433 is illustrated. However, embodiments are not limited thereto.

The hard layer 431 is coated on the external surface of the cover window 320 of the third exemplary embodiment, that is, the plane regions 22 and 23 and the rigid unit 322 and the soft unit 323 to increase the hardness of the cover window 320.

The anti-reflecting layer 432 is coated on the hard layer 431 to reduce the surface reflectance of the cover window 420. The anti-fingerprint layer 433 is oil or water repellent coated on the anti-reflecting layer 432 to reduce the surface energy of the cover window 420.

Hereinafter, the flexible display panel 10 on which outside the cover windows 20, 220, 320, and 420 of the first to fourth exemplary embodiments are disposed will be described.

Figure 9:
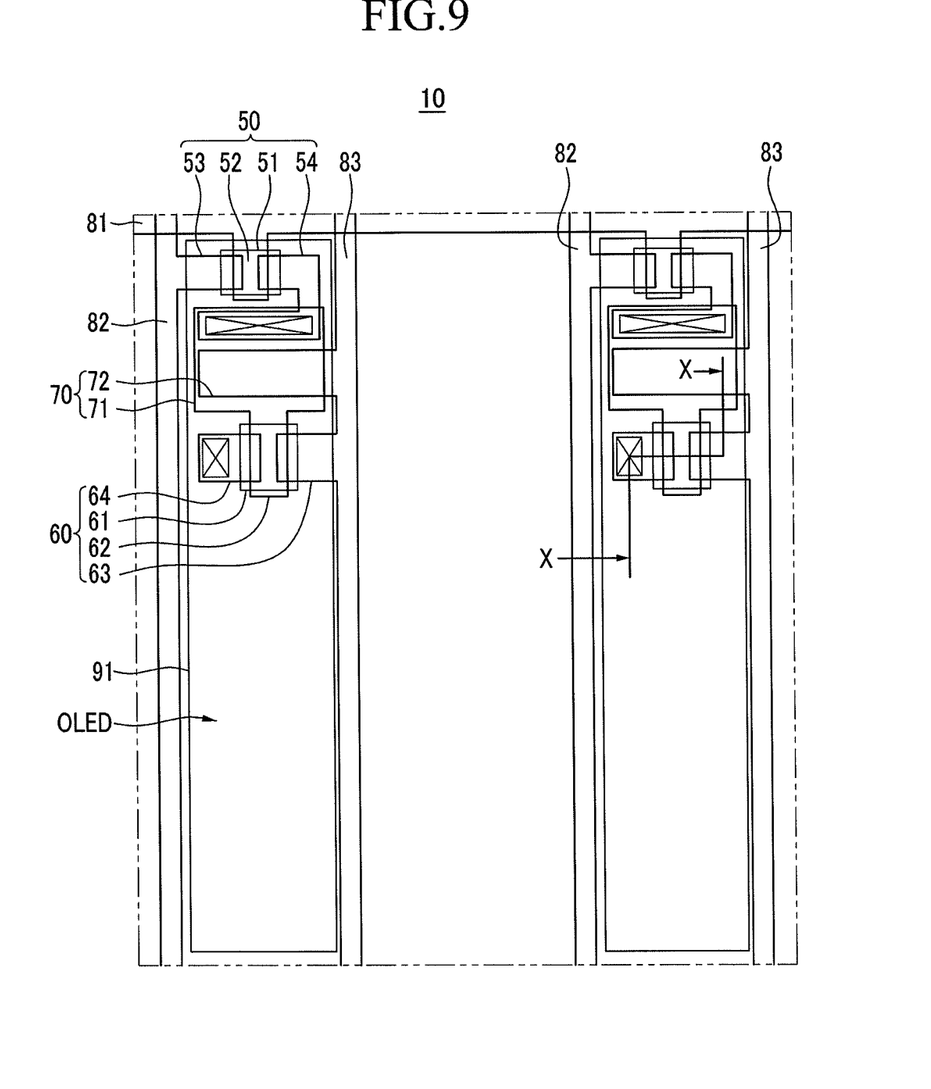
FIG. 9 is a layout view illustrating a pixel structure of a flexible display panel.
Figure 10:
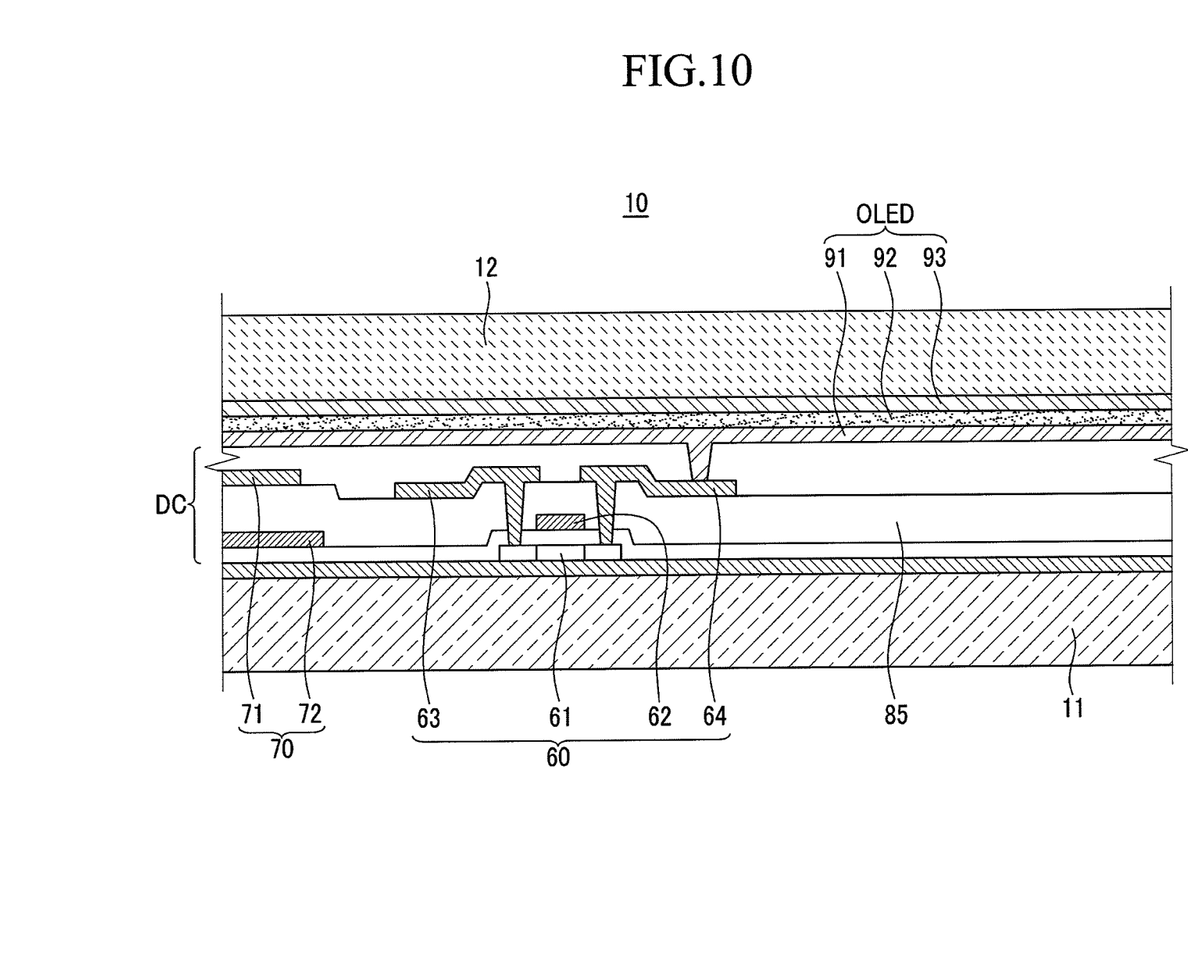
FIG. 10 is a cross-sectional view of the flexible display panel taken along the line X-X of FIG. 9.

FIG. 9 is a layout view illustrating a pixel structure of a flexible display panel, e.g., the flexible display panel illustrated in FIGS. 1 and 2. FIG. 10 is a cross-sectional view of the flexible display panel taken along the line X-X of FIG. 9. The flexible display panel 10 is not limited to the later described structure and may be formed of an organic light emitting diode (OLED) display or a flexible liquid crystal display (LCD) of another structure.

Referring to FIG. 9 and FIG. 10, the flexible display panel 10 includes a pixel circuit (DC) and an organic light emitting diode (OLED) formed in each pixel. The pixel circuit (DC) includes a switching thin film transistor 50, a driving thin film transistor 60, and a capacitor 70. The flexible display panel 10 includes a gate line 81 disposed in one direction, a data line 82 insulated from the gate line 81 and intersecting the gate line 81, and a common power line 83.

One pixel may be defined using the gate line 81, the data line 82, and the common power line 83 as a boundary, however, is not limited to the above. The pixel means a basic unit that displays an image. The flexible display panel 10 displays an image through a plurality of pixels.

In FIG. 9, the active matrix flexible display panel 10 of a 2Tr-1Cap structure in which two thin film transistors 50 and 60 and one capacitor 70 are provided in one pixel is illustrated. However, the structure of the flexible display panel 10 is not limited to the illustrated example. The flexible display panel 10 may include no less than three thin film transistors and no less than two capacitors. An additional wire may be further formed in the flexible display panel 10 so that the flexible display panel 10 may have various structures.

The organic light emitting diode (OLED) includes a pixel electrode 91, an organic emission layer 92, and a common electrode 93. One of the pixel electrode 91 and the common electrode 93 is a hole injection electrode and the other is an electron injection electrode. Light is emitted when electrons and holes are injected from the pixel electrode 91 and the common electrode 93 into the organic emission layer 92 and exciton in which the holes and the electrons are combined with each other is reduced from an exited state to a base state.

The pixel electrode 91 is formed of a metal having high reflectance and the common electrode 93 may be formed of a transparent conductive layer. In this case, the light of the organic emission layer 92 is reflected by the pixel electrode 91 and transmits the common electrode 93 and an encapsulation substrate 12 to be emitted to the outside. In FIG. 10, reference numeral 11 denotes a flexible substrate.

The capacitor 70 includes a pair of capacitor electrodes 71 and 72 disposed with an interlayer insulating layer 85 as a dielectric material interposed. Capacitance is determined by charge stored in the capacitor 70 and a voltage between the two capacitor electrodes 71 and 72.

The switching thin film transistor 50 includes a switching semiconductor layer 51, a switching gate electrode 52, a switching source electrode 53, and a switching drain electrode 54. The driving thin film transistor 60 includes a driving semiconductor layer 61, a driving gate electrode 62, a driving source electrode 63, and a driving drain electrode 64.

The switching thin film transistor 50 is used as a switch for selecting a pixel to emit light. The switching gate electrode 52 is conned to the gate line 81. The switching source electrode 53 is connected to the data line 82 and the switching drain electrode 54 is connected to one capacitor electrode 71.

The driving thin film transistor 60 applies driving power by which the organic emission layer 92 of the selected pixel emits light to the pixel electrode 91. The driving gate electrode 62 is connected to the capacitor electrode 71 connected to the switching drain electrode 54. The driving source electrode 63 and the other capacitor electrode 72 are connected to the common power line 83. The driving drain electrode 64 is connected to the pixel electrode 91 of the organic light emitting diode (OLED) through a contact hole.

The switching thin film transistor 50 is driven by a gate voltage applied to the gate line 81 to transmit a data voltage applied to the data line 82 to the driving thin film transistor 60. A voltage corresponding to a difference between a common voltage applied from the common power line 83 to the driving thin film transistor 60 and a data voltage transmitted from the switching thin film transistor 50 is stored in the capacitor 70. A current corresponding to the voltage stored in the capacitor 70 flows to the organic light emitting diode (OLED) through the driving thin film transistor 60 so that the organic emission layer 92 emits light.

By way of summation and review, a foldable display device may use a flexible display panel so that the foldable display device may be easily portable, it is folded and may realize a large screen when it is unfolded. Accordingly, embodiments relate to a foldable display device that may be unfolded and folded.

The foldable display device may include a cover window at the top of a lamination, and the cover window may protect the flexible display panel. Due to the characteristic of the foldable display device, the cover window should be able to be folded at a predetermined level, and should have a surface hardness at a level where the flexible display panel under the cover window may be protected. Accordingly, embodiments relate to providing a foldable display device that has a surface hardness at which a cover window has high foldability and the flexible display panel is safely protected.

According to an exemplary embodiment, since the plane region has the first hardness and the foldable region has the second hardness smaller than the first hardness, the cover window has high foldability in the foldable region and has large surface hardness in the plane regions. Further, since the functional coating layer is provided on the external surface of the cover window, the flexible display panel may be safely protected.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A foldable display device, comprising:
a flexible display panel; and
a cover window on an outside of the flexible display panel, the cover window including a foldable region between plane regions that are on opposite sides of the cover window, the plane regions having a first hardness and the foldable region having a second hardness that is smaller than the first hardness,
wherein:
each of the plane regions and the foldable region includes a polymer of poly(methyl methacrylate) (PMMA) and poly(n-butylacrylate) (PnBA), and
an amout of PnBA in the polymer of PMMA and PnBA in the foldable region is different from an amount of PnBA in the polymer of PMMA and PnBA in the plane regions.

2. The foldable display device of claim 1, wherein, in the plane regions, an amount of PMMA in the polymer of PMMA and PnBA of the plane regions is larger than an amount of PnBA in the polymer of PMMA and PnBA forming of the plane regions.

3. The foldable display device of claim 1, the amount of PnBA in the polymer of PMMA and PnBA of the foldable region is greater than the amount of PnBA in the polymer of PMMA and PnBA of the plane regions.

4. The foldable display device of claim 1, wherein:
the plane regions are formed of tempered glass, and
the foldable region is formed of an acryl-based resin.

5. The foldable display device of claim 1, wherein the cover window includes a functional coating layer on external surfaces of the plane regions and the foldable region.

6. The foldable display device of claim 5, wherein the functional coating layer includes at least one of:
a hard layer that increases a hardness of the cover window,
an anti-reflecting layer that reduces surface reflectance of the cover window, and
an anti-fingerprint layer that reduces surface energy of the cover window.

7. The foldable display device of claim 1, wherein:
the foldable region has a first width, and
the foldable region includes a plurality of rigid units and soft units that are alternately arranged in the foldable region, one of the rigid units and one of the soft units being partitioned with a second width that is smaller than the first width.

8. The foldable display device of claim 7, wherein the cover window includes a functional coating layer on external surfaces of the plane regions and the rigid units and the soft units.

9. A foldable display device, comprising:
a flexible display panel; and
a cover window on an outside of the flexible display panel, the cover window including a foldable region between plane regions that are on opposite sides of the cover window, the plane regions having a first hardness and the foldable region having a second hardness that is smaller than the first hardness,
wherein:
the foldable region has a first width, and
the foldable region includes a plurality of rigid units and soft units that are alternately arranged in the foldable region, one of the rigid units and one of the soft units being partitioned with a second width that is smaller than the first width.

10. The foldable display device of claim 9, wherein the cover window includes a functional coating layer on external surfaces of the plane regions and the rigid units and the soft units.

11. The foldable display device of claim 10, wherein the functional coating layer includes at least one of:
a hard layer that increases a hardness of the cover window,
an anti-reflecting layer that reduces surface reflectance of the cover window, and
an anti-fingerprint layer that reduces surface energy of the cover window.

* * * * *